United States Patent
Zhang et al.

(10) Patent No.: US 7,911,364 B1
(45) Date of Patent: Mar. 22, 2011

(54) INTERLEAVER FOR TURBO EQUALIZATION

(75) Inventors: Yifei Zhang, Sunnyvale, CA (US); Kiran Gunnam, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 2 days.

(21) Appl. No.: 12/203,691

(22) Filed: Sep. 3, 2008

Related U.S. Application Data

(60) Provisional application No. 60/969,809, filed on Sep. 4, 2007.

(51) Int. Cl.
*H03M 7/00* (2006.01)
(52) U.S. Cl. .......................... 341/81; 341/51
(58) Field of Classification Search .............. 341/50, 341/51, 81; 370/352, 380, 400, 427
See application file for complete search history.

(56) References Cited

U.S. PATENT DOCUMENTS

| | | | |
|---|---|---|---|
| 6,337,642 B1 * | 1/2002 | Yagil | 341/50 |
| 6,603,412 B2 * | 8/2003 | Gatherer et al. | 341/61 |
| 6,892,335 B2 * | 5/2005 | Gueguen | 714/701 |
| 7,360,040 B2 * | 4/2008 | Suzuki et al. | 711/157 |
| 7,395,461 B2 * | 7/2008 | Argon et al. | 714/701 |
| 7,453,960 B1 | 11/2008 | Wu et al. | |
| 7,536,623 B2 * | 5/2009 | Kim et al. | 714/752 |
| 7,724,163 B2 * | 5/2010 | Wong et al. | 341/81 |
| 7,760,114 B2 * | 7/2010 | Neeman et al. | 341/81 |
| 2005/0281111 A1 | 12/2005 | Urard et al. | |
| 2005/0283707 A1 | 12/2005 | Sharon et al. | |
| 2008/0276156 A1 | 11/2008 | Gunnam et al. | |
| 2008/0301521 A1 | 12/2008 | Gunnam et al. | |
| 2009/0037791 A1 | 2/2009 | Pavlov et al. | |

OTHER PUBLICATIONS

Gunnam, K.K., "Area and Energy Efficient VLSI Arcidtectures for Low•Density Parity•Check Decoders Using an on•The-Fly Computation," A Dissertation Submitted to the Office of Graduate Studies of Texas A&M University in partial fulfillment of the requirements for the degree of Doctor of Philosophy (Dec. 2006).

Gunnam, K.K., et al., "Technical Note on Iterative LDPC Solutions for Turbo Equalization" (Jul. 2006).

Gunnam, K., et al., "An LDPC Decoding Schedule for Memory Access Reduction," *Proceedings of the IEEE International Conference on Acoustics, Speech, and Signal Processing 2004*, vol. 5, pp. V-173 through V-176 (May 17-21, 2004).

Gunnam, K., et al., "VLSI Architectures for Turbo Decoding Message Passing Using Min-Sum for Rate-Compatible Array LDPC Codes" *2nd International Symposium on Wireless Pervasive Computing, 2007* pp. 561-566 (2007).

Gunnam, K., et al., "Multi-Rate Layered Decoder Architecture for Block LDPC Codes of the IEEE 802.11n Wireless Standard," *IEEE International Symposium on Circuits and Systems, 2007*, pp. 1645-1648 (May 27-30, 2007).

Gunnam, K., et al., "A Low Power Preamble Detection Methodology for Packet Based Modems," Texas A&M University, ECE Technical Report, Jun. 2006, TAMU-ECE-Jun. 2006 (dropzone.tamu.edu).

Gunnam, K.K., et al., "Decoding of Quasi-cyclic LDPC Codes Using an On-the-Fly Computation," *Fortieth Asilomar Conference on Signals, Systems, and Computers, 2006*, pp. 1192-1199 (2006).

(Continued)

*Primary Examiner* — Brian Young

(57) ABSTRACT

A plurality of "local" interleavers replaces a single global interleaver for processing encoded data. If the encoded data may be represented as a matrix of data blocks, or "circulants," each local interleaver can be the size of one or a small number of circulants. Thus, for example, if the matrix has a certain number of rows and columns, the number of local interleavers may be equal to the number of columns. Each local interleaver is small so latency is low.

19 Claims, 15 Drawing Sheets

OTHER PUBLICATIONS

Gunnam, K.K., et al., "VLSI Architectures for Layered Decoding for Irregular LDPC Codes of WiMax" *IEEE International Conference on Communications 2007-ICC-2007*, pp. 4542-4547, Jun. 24-28, 2007.

Gunnam, K.K., et al., "A Parallel VLSI Architecture for Layered Decoding," Texas A&M University, ECE Technical Report, May 2007, TAMU-ECE-May 2007 (dropzone.tamu.edu).

Gunnam, K.K., et al., "Next Generation Iterative LDPC Solutions for Magnetic Recording Storage," *2008 Asilomar Conference on Signals, Systems, and Computers*, pp. 1148-1152 (Oct. 26-28, 2008).

Hocevar, D.E., "A Reduced Complexity Decoder Architecture via Layered Decoding of LDPC Codes" *IEEE Workshop on Signal Processing Systems 2004*, pp. 107-112 (Oct. 13-15, 2004).

Sharon, E., et al., "An Efficient Message-Passing Schedule for LDPC Decoding," *Proceedings of the 2004 23rd IEEE Convention of Electrical and Electronics Engineers in Israel*, pp. 223-226 (Sep. 6-7, 2004).

Sun, Y., et al., "High Throughput, Parallel, Scalable LDPC Encoder/Decoder Architecture for OFDM Systems," *2006 IEEE Dallas/CAS Workshop on Design Applications, Integration and Software*, pp. 39-42 (Oct. 2006).

Sun, Y., "VLSI Decoder Architecture for High-Throughput, Variable Block-size and Multi-rate LDPC Codes," *IEEE International Symposium on Circuits and Systems, 2007*, pp. 2104-2107 (May 27-30, 2007).

Wang, W., et al., "Low-Power VLSI Design of LDPC Decoder Using DVFS for AWGN Channels," *2009 22nd International Conference on VLSI Design*, pp. 51-56 (Jan. 8-9, 2009).

\* cited by examiner

INTERLEAVER FOR TURBO EQUALIZATION

CROSS REFERENCE TO RELATED APPLICATION

This claims the benefit of U.S. Provisional Patent Application No. 60/969,809, filed Sep. 4, 2007, which is hereby incorporated by reference herein in its entirety.

BACKGROUND

This invention relates to a method and apparatus for efficient iterative decoding of a turbo-encoded data channel.

In many applications, data—e.g., on a communication channel or in the read channel of a data storage device—is encoded using an outer code. Examples of such codes include turbo codes, Low-Density Parity Check (LDPC) codes, and convolutional codes. Encoded data from an outer code are often interleaved before being transmitted over a data channel. In that data channel, the signal might become corrupted with noise or defects. On the receiver side, the received signal can be decoded using an iterative decoding principle often referred to as turbo decoding. A feature of turbo decoding is that decoding includes multiple stages, each of which includes a detection/equalization block and an outer decoder block. For example, the signal from a detector front end, which may be a finite impulse response (FIR) filter, may be processed by a soft detector such as a Soft Output Viterbi Algorithm (SOVA).

The soft detector provides two outputs—(i) hard decisions for the detected signal and (ii) extrinsic log-likelihood ratios (LLRs), which indicate new reliability information generated by the detector for each of the hard decisions. These LLRs are then de-interleaved and passed to the outer decoder for further processing. The outer soft decoder then provides its own hard decisions as well as new extrinsic LLRs. These LLRs from the outer decoder are then passed to the soft detector as a priori LLRs after interleaving. In the next round of iterative decoding, the soft detector generates new extrinsic LLRs, taking both the a priori LLRs and the FIR signal as inputs. For the first iteration, the a priori LLR inputs to the soft detector are all set to zero. This iterative decoding between soft detector and the outer decoder is carried out until a maximum number of iterations are reached, or a valid code word is found.

In a known arrangement, each sector of a disk drive may be decoded using three SOVAs, each of which generates two LLRs during each clock cycle. This results in six LLRs per clock cycle. These are interleaved using a global interleaver. However, a global interleaver has high complexity, with high memory and computation requirements. The entire sector must be interleaved before any data can be returned. This requires buffering the entire sector, increasing latency. Moreover, a separate global de-interleaver, with similar memory requirements, also is needed.

SUMMARY

In accordance with the invention, a plurality of "local" interleavers replaces a single global interleaver for processing the encoded sector data. For example, for quasi-cyclic LDPC-encoded data, the parity check matrix (or "H-matrix") is composed of circulants with dimension $S_c \times S_c$. The encoded data can be grouped into blocks correspondingly with $S_c$ bits in each block. The local interleaver may be applied to each block; sometimes, each block is replaceable by a circulant. Also, because each coded bit corresponds to each column of the H-matrix, we may also say a block of coded bits corresponds to one block column of the H-matrix. Each local interleaver can be the size of one or a small number of circulants. Thus, for example, if the matrix has a certain number of rows and columns, the number of local interleavers may be equal to the number of columns. Each local interleaver is small so latency is low.

Therefore, in accordance with the present invention, there is provided a method for decoding a block of data in a data channel that uses iterative decoding. The method includes breaking the block of data into smaller blocks, interleaving data in each of the smaller blocks, and decoding the interleaved data.

Apparatus for carrying out the method also is provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

The present invention reduces both memory usage and latency in turbo decoding by providing a large number of local interleavers to replace a single global interleaver. Several different types of interleaving techniques may be used in each interleaver, including block interleaving, cyclic permutation and random interleaving. In addition, a single interleaver can combine more than one interleaving technique. The several interleavers of a single decoder may all be of the same type, or different types may be mixed in a single decoder. Each type of interleaver may have different memory and logic usage, as well as different performance characteristics, as discussed in more detail below, which may affect the choice of interleaver types.

Figure 1:
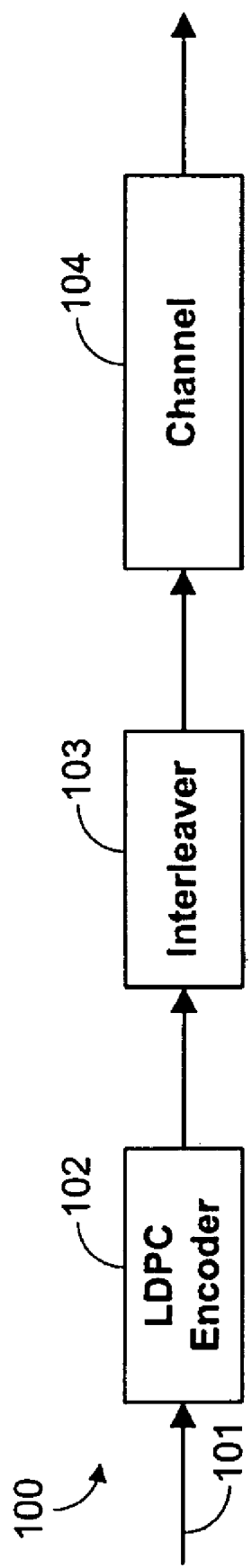
FIG. 1 is a schematic representation of the encoding side of a data channel in which an interleaver is used.
Figure 2:
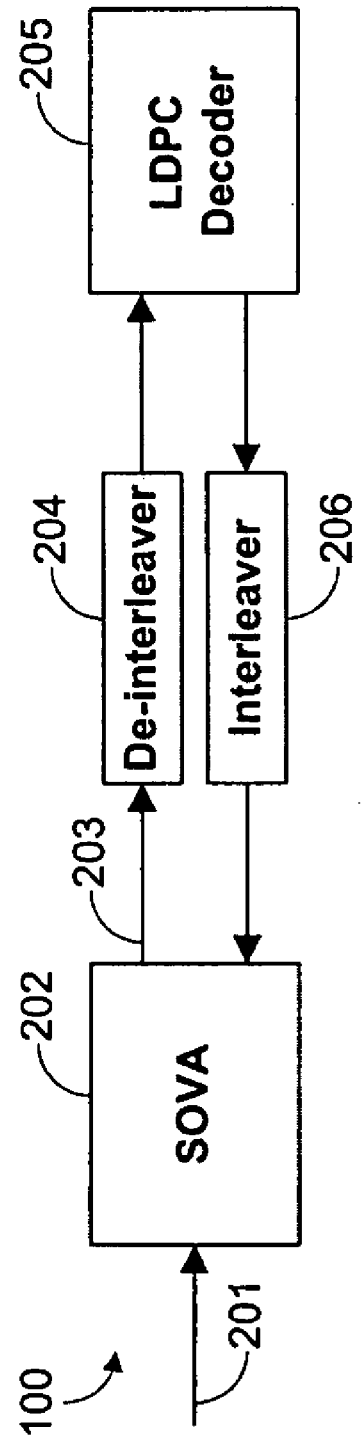
FIG. 2 is a schematic representation of the decoding side of a data channel in which an interleaver is used.

FIGS. 1 and 2 show how an interleaver may be used in a data channel. FIG. 1 represents the encoding side of a data channel 100 in which user data are input at 101, encoded using an outer code such LDPC 102, interleaved at 103, and then output to channel 104 (e.g., for writing to a disk drive). Similarly, FIG. 2 represents the decoding side of data channel 100, where encoded data (e.g., data read from a disk drive) are input at 201 to a detector such as SOVA 202, which produces LLR output 203. Output 203 is iteratively decoded by de-interleaving at 204, decoding by an outer decoder such as LDPC decoder 205, re-interleaving at interleaver 206, reprocessing by SOVA 202, etc. There may be, e.g., three or more iterations.

Figure 3:
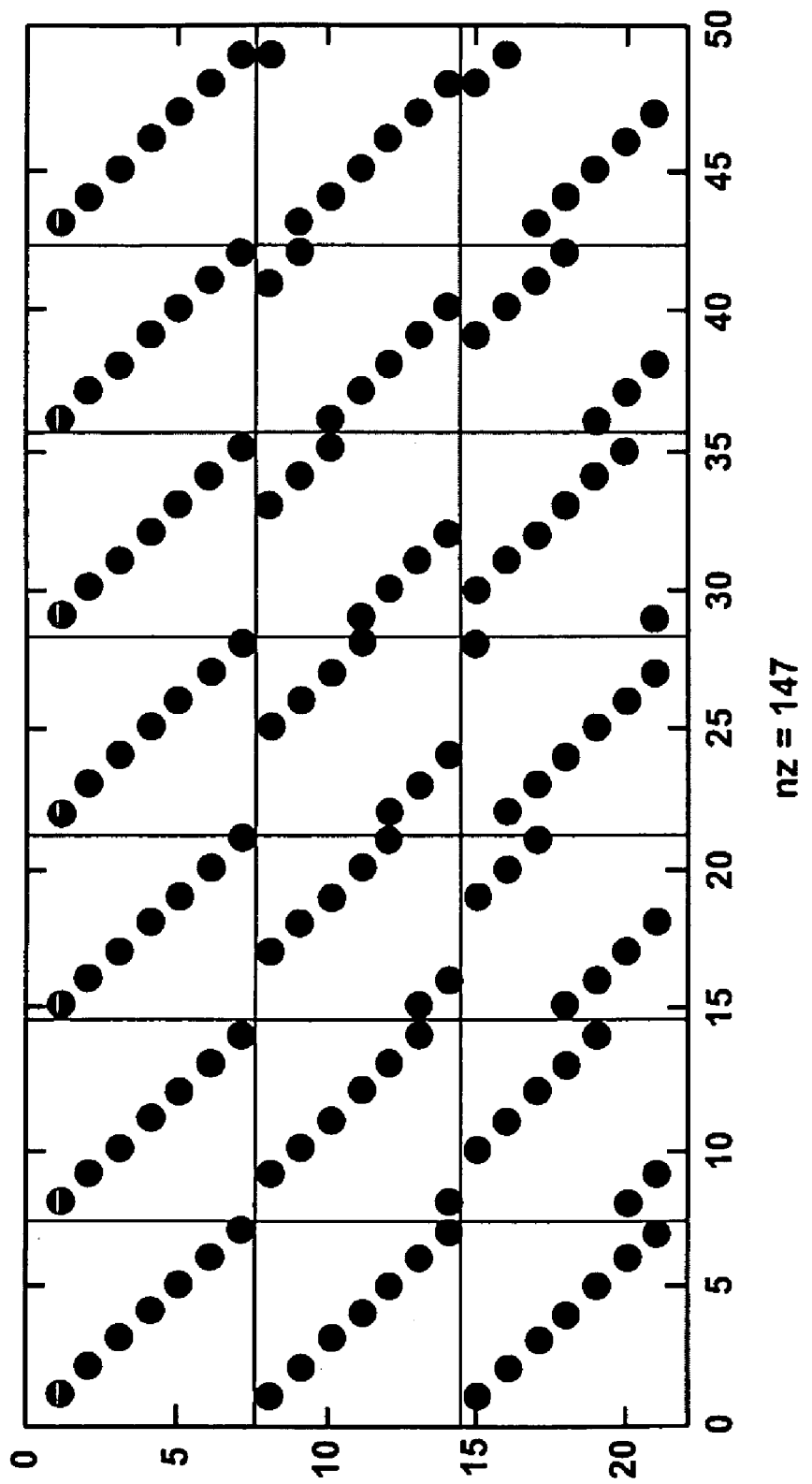
FIG. 3 shows how a block of data may be encoded in a way that allows it to be broken down into smaller blocks.

FIG. 3 shows the H-matrix for quasi-cyclic LDPC-encoded data (e.g., representing a disk drive sector) which may be broken down into smaller blocks or circulants so that it can be interleaved/de-interleaved using local interleavers/de-interleavers according to the invention. In the remainder of this discussion, only interleaving will be described, but the principles of the invention apply equally to de-interleaving, and all references to interleaving or interleavers, including references in the claims which follow, should be considered references to de-interleavers as well.

In FIG. 3, the data have been encoded using a quasi-cyclic LDPC (QC-LDPC) code, although the invention may be used with any structured LDPC code. The resulting matrix includes small submatrices, each of which can be a zero matrix or a circulant. A circulant is derived by cyclically shifting each row of an identity matrix. In this example, there is no zero matrix. Each dot in FIG. 3 represents a "1" while each of the blank spaces represents a "0". The cyclic pattern of the data, which is apparent, inherently suggests the size of the small blocks ("circulant size"). Thus, for data of size m×n, if the size of each small block or circulant is defined as $S_c$, the H-matrix will have $N_p = n/S_c$ block columns and $M_p = m/S_c$ block rows.

A single global interleaver for processing the data in FIG. 3 would require a size $n = N_p \times S_c$. A local interleaver in accordance with the invention has a size equal to $a \times S_c$, where a is a number relatively smaller than $N_p$. For example, a could be in the range of 1-3. Rather than interleaving the entire matrix, each local interleaver will interleave only the bits within a block columns, where a block columns is a "perfect subset" of the $N_p$ block columns—i.e., one or a plurality, but fewer than all $N_p$ block columns.

Figure 4:
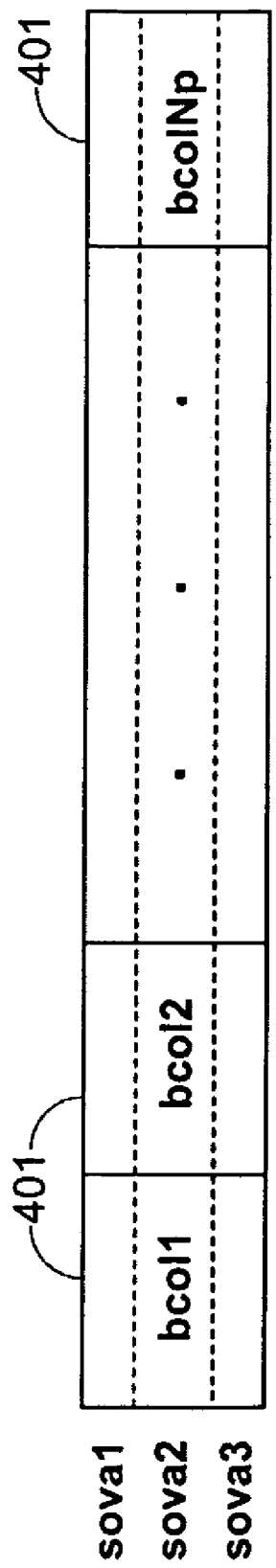
FIG. 4 shows how a data are processed in a single block column according to an embodiment of the invention.
Figure 5:
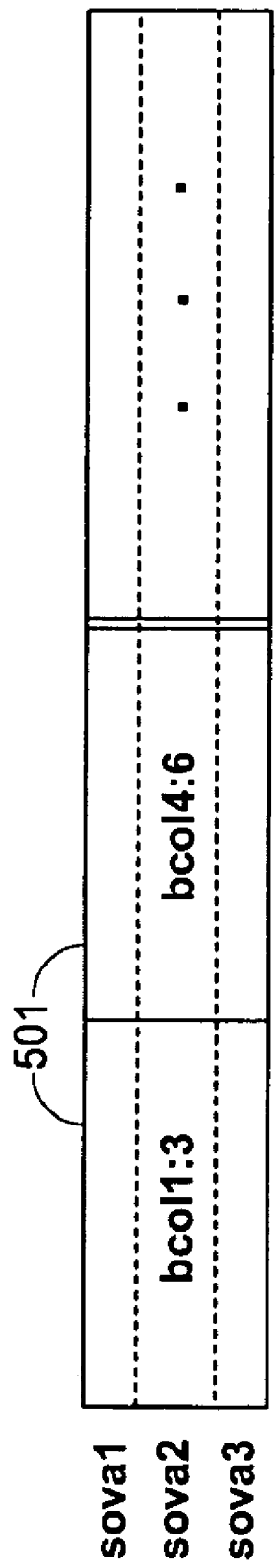
FIG. 5 shows how a data are processed in three block columns according to the invention.

In one group of exemplary embodiments, the size of each local interleaver may be the same as the circulant size $S_c$ (a=1). These may be referred to as "Class I" embodiments. In the Class I embodiments, for the matrix described above, there would be $N_p$ local interleavers, each of which interleaves $S_c$ bits within one block column 401, as shown in FIG. 4. In another group of exemplary embodiments, the size of each local interleaver may be three times the circulant size $S_c$ (a=3). These may be referred to as "Class II" embodiments. In the Class II embodiments, for the matrix described above, there would be ceil($N_p/3$) local interleavers, each of which interleaves $3 \times S_c$ bits within groups 501 of three block columns, as shown in FIG. 5.

Each local interleaver may be any one of:
1. A block interleaver, in which a sequence of length n may be written row-by-row into a matrix of size s×t (where s×t=n) but read column-by-column;

2. A cyclic permutation interleaver, which cyclically permutes the LLRs in the block or blocks on which it operates;

3. A random interleaver, which (pseudo)randomly rearranges the LLRs in the block or blocks on which it operates; or 4. A combination of two or more of the above. In addition, within any one embodiment, the ceil($N_p/a$) local interleavers could all be of the same type, or could be a mix of different types. The types and distribution of types of interleavers affect the performance (signal loss), memory and logic usage. Therefore, the choice of embodiment depends on the particular design.

The Class I embodiments, each operating a single block column at a time, may include any of at least the following six possible embodiments:

| Version | Relation of $N_p$ local interleavers | Type of local interleaver | Effect on Performance | Additional Memory and Logic |
|---|---|---|---|---|
| I | Different | Block interleaver | Little loss. | 2 Buffers of $S_c$ LLRs. |
| II | Same | Block interleaver | 0.1-0.2 dB loss. | 2 Buffers of $S_c$ LLRs. |
| III | Different | Cyclic permutations | 0.4-0.5 dB loss. | 2 Buffers of $S_c$ LLRs. |
| IV | Same | Random | No loss. | 2 Buffers of $S_c$ LLRs. 6 $S_c$:1 multiplexers. |
| V | Different | Cyclic permutation (different) and block interleaver (same) | Little loss. No loss for TA. | 2 Buffers of $S_c$ LLRs. |
| VI | Different | Cyclic permutation (different) plus combination of 18 × 18 random interleavers (same) | No loss. | 2 Buffers of $S_c$ LLRs organized as $S_c/(18 \times 18)$. 6 18:1 multiplexers. |

Within these embodiments, the $N_p$ local interleavers can be the same, or one or more can be different from the others. Either way, it would take ceil($S_c/6$) clock cycles to fill in the interleaver buffer.

As an example, consider the application of Version IV to a 0.5K LDPC code having a circulant size $S_c = 64$, and a mother matrix having $N_p = 76$ block columns and $M_p = 12$ block rows. The H-matrix size would be $n = 76 \times 64 = 4868$, $m = 12 \times 64 = 768$. To keep the column weight at 3, some circulants are masked to zero. All interleavers in this version preferably are random interleavers of length = $S_c = 64$. The 64 LLRs for each block column would be expected to be ready in ceil($S_c/6$) = ceil(64/6) = ceil(10.66) = 11 clock cycles.

Figure 6:
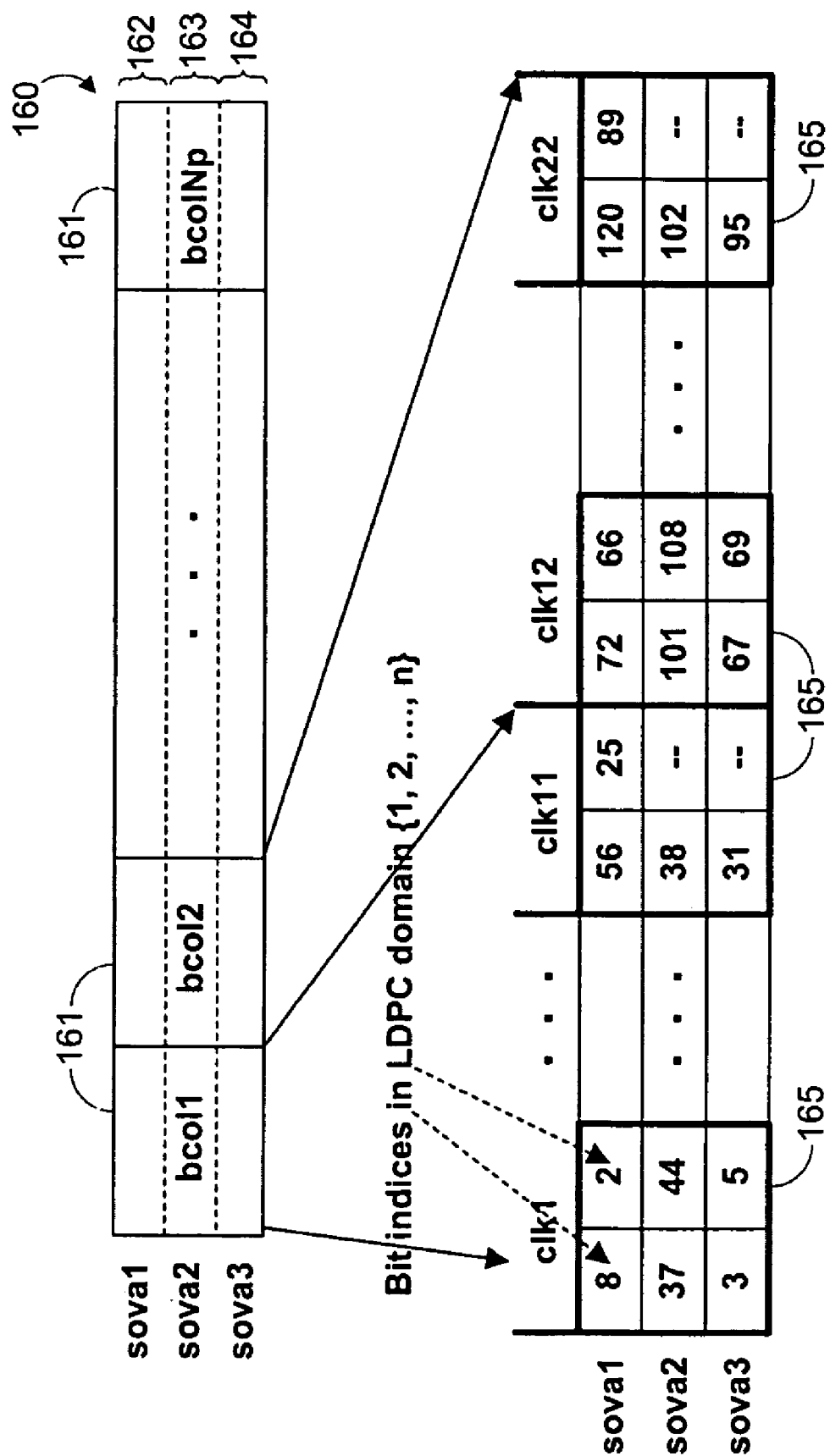
FIG. 6 shows how a single block column may be interleaved according to first embodiment of the invention.

As seen in FIG. 6, matrix 160 includes $N_p$ block columns 161, each including contributions 162 from SOVA1, contributions 163 from SOVA2 and contributions 164 from SOVA3. Each block column is interleaved over the 11 clock cycles used to derive the 64 LLRs. Thus, as shown, block column 1 (BCOL1) is interleaved over clock cycles CLK1 through CLK11, while block column 2 is interleaved over clock cycles CLK12 through CLK22, etc. FIG. 6 shows the indices 1-64 of the LLRs in the interleaved blocks 165. As can be seen, in the interleaved blocks in the first 11 clock cycles, resulting from interleaving of block column 1, although the indices are randomly distributed, all of them are between 1 and 64. Similarly, in the interleaved blocks in the second 11 clock cycles, resulting from interleaving of block column 2, all of the indices are between 65 and 128.

In addition to the interleavers themselves, this example uses two buffers each capable of holding $S_c$ LLRs, as well as six $S_c$:1 multiplexers.

Figure 7:
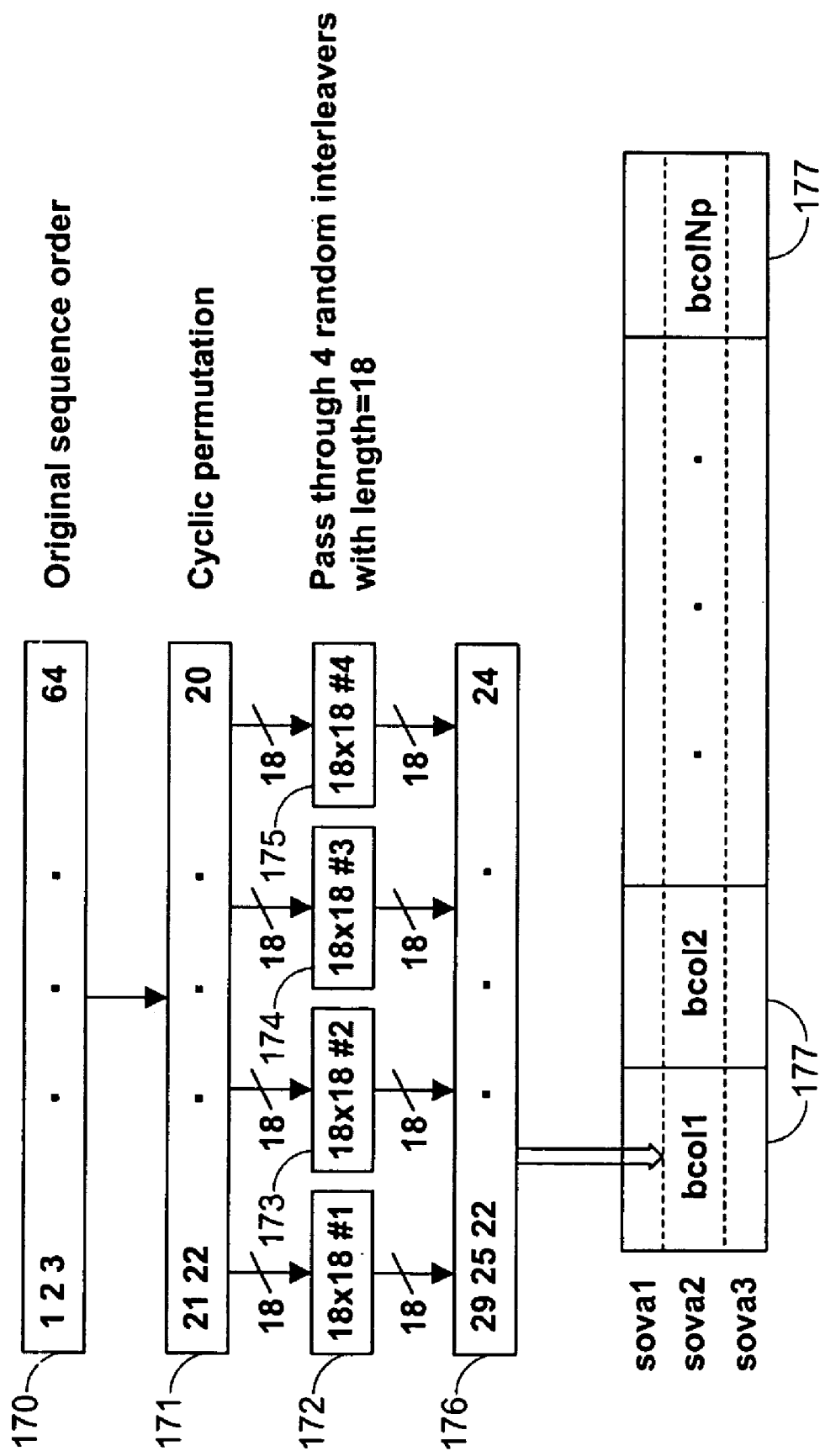
FIG. 7 shows how a single block column may be interleaved according to second embodiment of the invention.

As another example, consider the application of Version VI to the same LDPC code. In this example, diagrammed in FIG. 7, the 64 LLRs start out in their original order 170 and first are cyclically permuted at 171 (in the example shown, the LLRs originally ordered 1-64 are reordered 21-64 and 1-20). The permuted LLRs are then interleaved by four 18×18 interleavers 172-175 (because there are 64—rather than 72—LLRs, only ten LLRs are interleaved by fourth interleaver 175) which preferably are random interleavers as in the previous example, to provide interleaved LLRs 176 for each of block columns 177.

In addition to the interleavers themselves, this example uses two buffers each capable of holding $S_c$ LLRs, organized as $S_c/(18 \times 18)$ (i.e., as $S_c/18$ groups of 18 LLRs each), as well as six 18:1 multiplexers.

The Class II embodiments, each having ceil($N_p/3$) local interleavers operating on three block columns at a time, may include at least the following embodiment:

| Version | Relation of ceil($N_p/3$) local interleavers | Type of local interleaver | Effect on Performance | Additional Memory and Logic |
|---|---|---|---|---|
| VII | Same | Simple cyclic shift among the three block columns | No loss | 6 dual-port buffers of $S_c$ LLRs |

In this, as well as other, Class II embodiments, the number a generally should match the number of SOVAs. Thus, in these examples, there are three SOVAs and a=3. If there were four SOVAs, a preferably should be 4, but a smaller interleaver is preferred and simulations show that a=3 would be sufficient even if there were four SOVAs. The 64 LLRs for each block column would be expected to be ready in ceil($3 \times S_c/6$)=ceil(192/6)=ceil(32)=32 clock cycles.

Figure 8:
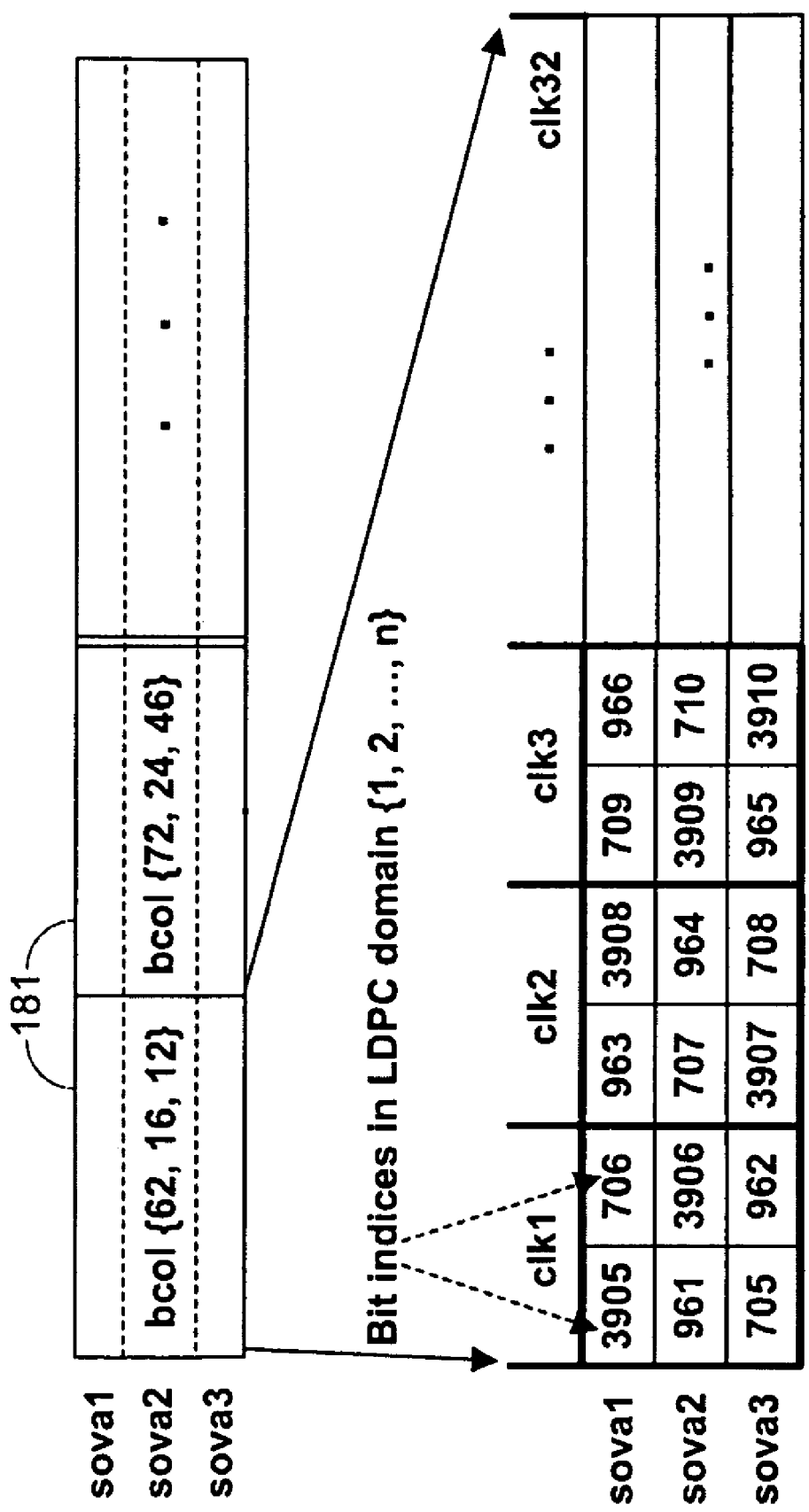
FIG. 8 shows how three block columns may be interleaved according to third embodiment of the invention.

FIG. 8 shows the application of Version VII to the same LDPC code as in the previous examples. In this example, the 76 block columns are first interleaved randomly. Then the LLRs from three block columns—in this example, the first two groups 181 of three block columns are block columns 62, 16 and 12 and 72, 24 and 46—are cyclically permuted. Within these groups 181, the three block columns are interleaved over the 32 clock cycles used to derive the LLRs. Thus, as shown, block columns 62, 16 and 12 are interleaved over clock cycles CLK1 through CLK32, while block columns 72, 24 and 46 would be interleaved over clock cycles CLK33 through CLK64, etc.

FIG. 8 shows the indices 3905-3968, 961-1024 and 705-768 of the LLRs in the three block columns 62, 16 and 12, respectively. The simple cyclic distribution of these indices over the various clock cycle can easily be seen in FIG. 8.

In addition to the interleavers themselves, this example uses six dual-port buffers each capable of holding $S_c$ LLRs.

Simulations of these interleavers on a data channel, whether with or without detectable thermal asperity, shows performance comparable to that of a global interleaver, with comparable signal error rate for a given signal-to-noise ratio.

One may also consider the case of a 0.5K LDPC code having no zero circulants. In such a case, to keep within the capabilities of the decoder, the circulant size may be enlarged to $S_c=256$. The same H-matrix described above would have n=19×256=4868, m=3×256=768, $N_p$=19 block columns and $M_p$=3 block rows. For this case, a further Version VIII may be described:

| Version | Relation of ceil($N_p/3$) local interleavers | Type of local interleaver | Effect on Performance | Additional Memory and Logic |
|---|---|---|---|---|
| VIII | Same | Cyclic shift among the three block columns (different for each circulant) plus block interleaver per block column (same for each circulant) | No loss | 2 buffers of $S_c$ LLRs |

Versions V, VI, VII and VIII may be applied to the case of no zero circulants as follows:

| Version | Relation of $N_p$ local interleavers | Type of local interleaver | Effect on Performance | Additional Memory and Logic |
|---|---|---|---|---|
| V | Different | Cyclic permutation (different) and block interleaver (same) | ~0.2 dB loss | 2 Buffers of $S_c$ LLRs. |
| VI | Different | Cyclic permutation (different) plus combination of 32 × 32 random interleavers (same) | Little loss. | 2 Buffers of $S_c$ LLRs organized as $S_c/(32 \times 32)$. |
| VII | Same | Simple cyclic shift among the three block columns | If no TA, little loss; With TA, ~0.2-0.3 db loss | 6 dual-port buffers of $S_c$ LLRs |
| VIII | Same | Cyclic shift among the three block columns (different for each circulant) plus block interleaver per block column (same for each circulant) | No loss | 2 buffers of $S_c$ LLRs |

Figure 9:
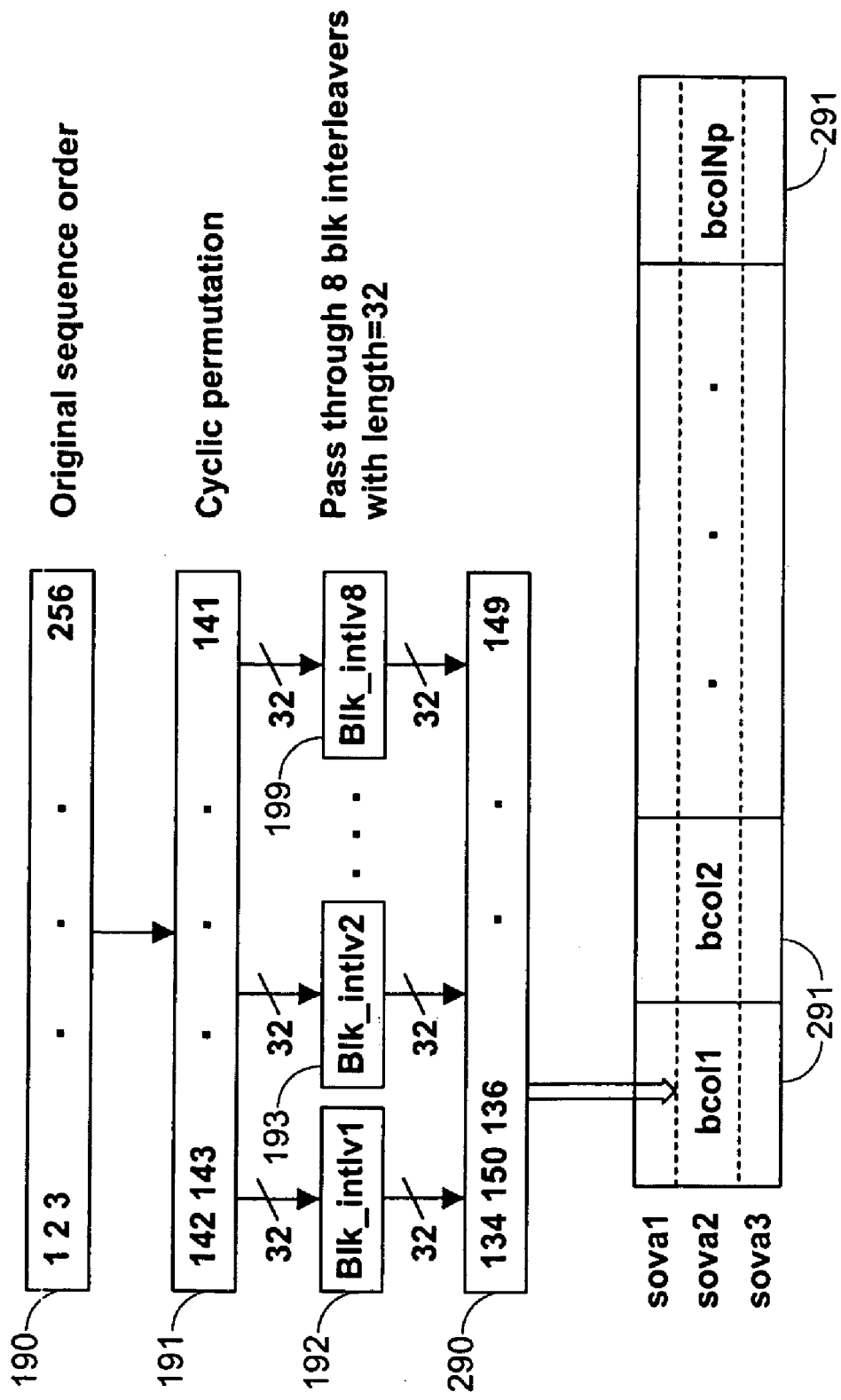
FIG. 9 shows how a single block column may be interleaved according to fourth embodiment of the invention.

In the example diagrammed in FIG. 9, the LLRs start out in their original order 190 and first are cyclically permuted at 191 (in the example shown, the LLRs originally ordered 1-256 are reordered 142-256 and 1-141). The permuted LLRs are then interleaved by eight block interleavers 192-199 (here, although the circulant size is increased from 64 to 256, the length of the individual block interleavers is reduced to 32) which preferably are random interleavers as in the previous example, to provide interleaved LLRs 290 for each of block columns 291.

Figure 10:
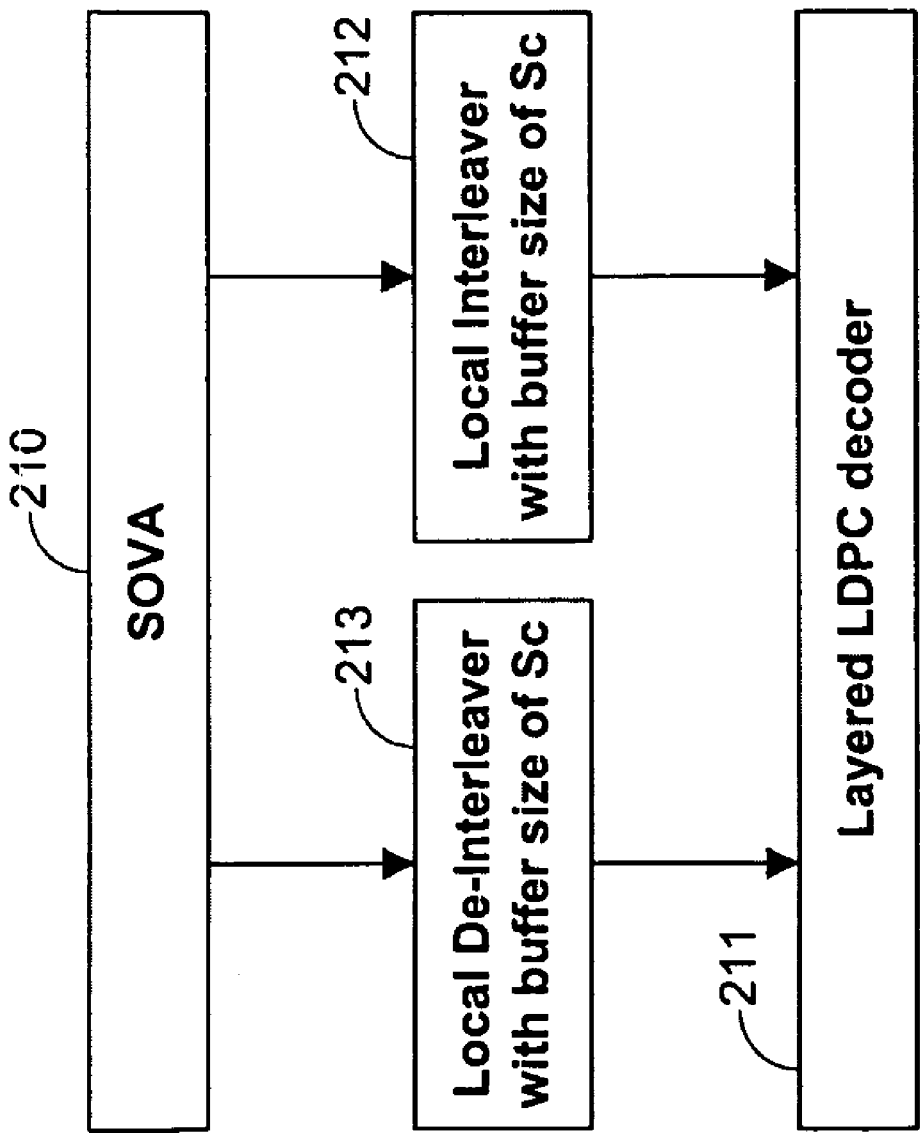
FIG. 10 is a block diagram of a hardware arrangement according to the invention.

The hardware configuration of a channel decoder incorporating the invention is shown in FIG. 10. Between SOVA (or SOVAs) 210 and layered LDPC decoder 211 is only the local interleaver 212 and de-interleaver 213 with buffer sizes on the order of $S_c$, rather than on the order of the sector size as was previously known. The use of a layered decoder allows the use of a single buffer instead of two buffers. The use of multiple SOVAs per sector, preferably coupled with the use of a quasi-cyclic code, allows the code matrix to be broken down into block columns that can be interleaved/de-interleaved individually. This results in lower hardware complexity and lower latency, while keeping performance comparable to that of a global interleaver.

Figure 11:
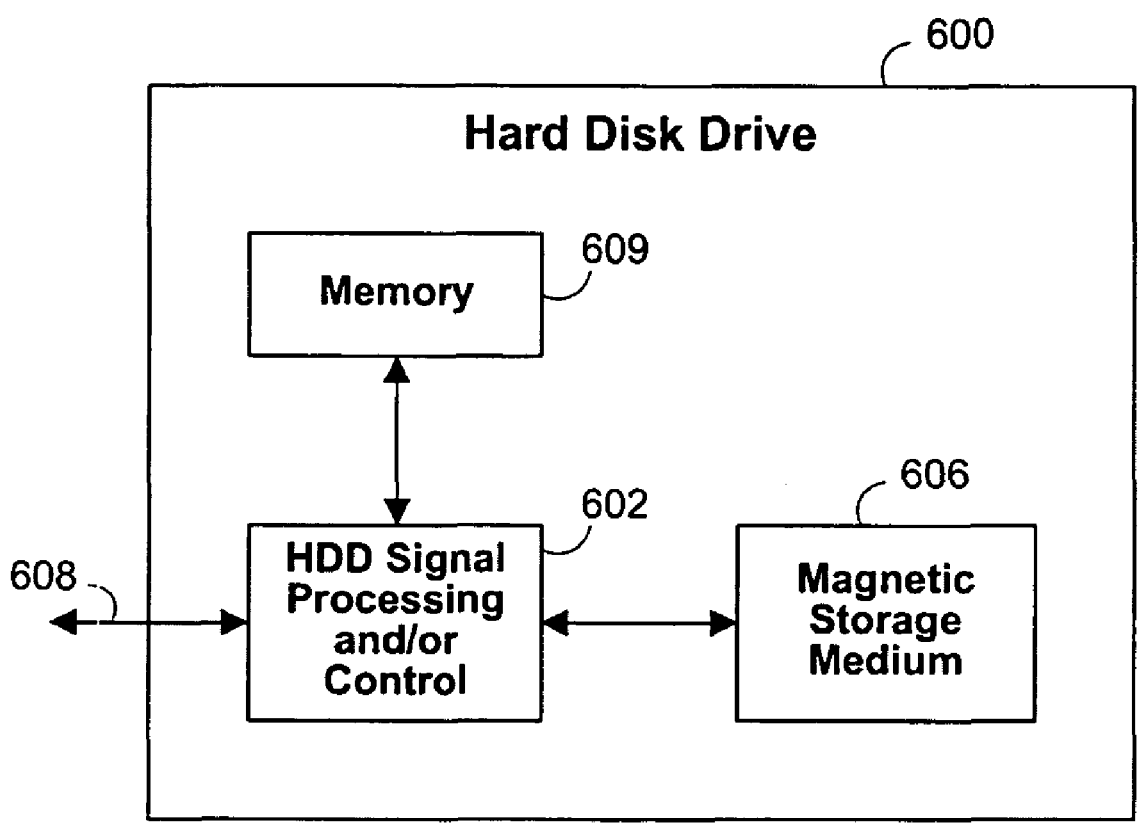
FIG. 11 is a block diagram of an exemplary hard disk drive that can employ the disclosed technology.
Figure 12:
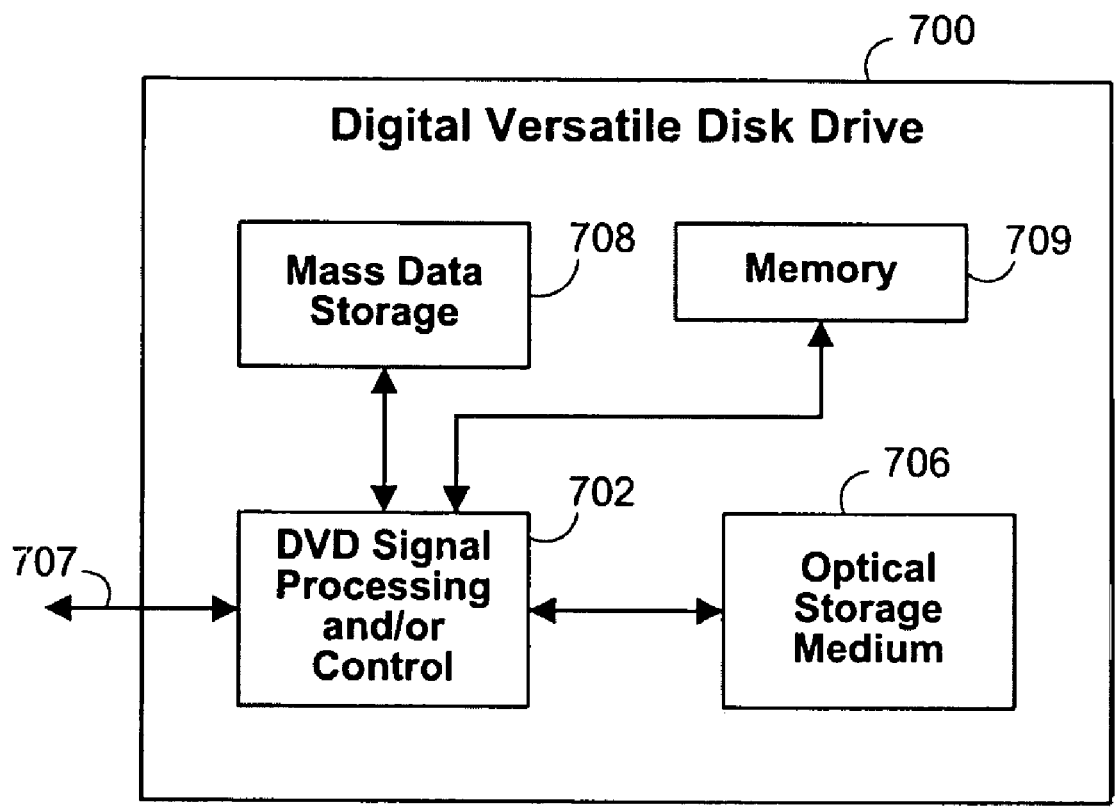
FIG. 12 is a block diagram of an exemplary digital versatile disk drive that can employ the disclosed technology.

Referring now to FIGS. 11 and 12, two exemplary implementations of the present invention are shown.

Referring now to FIG. 11 the present invention can be implemented in a hard disk drive 600. The present invention may implement either or both signal processing and/or control circuits, which are generally identified in FIG. 11 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Referring now to FIG. 12 the present invention can be implemented in a digital versatile disk (DVD) drive 700. The present invention may implement either or both signal processing and/or control circuits, which are generally identified in FIG. 12 at 702, and/or mass data storage of the DVD drive 700. The signal processing and/or control circuit 702 and/or other circuits (not shown) in the DVD drive 700 may process data, perform coding and/or encryption, perform calculations, and/or format data that is read from and/or data written to an optical storage medium 706. In some implementations, the signal processing and/or control circuit 702 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 707. The DVD drive 700 may communicate with mass data storage 708 that stores data in a nonvolatile manner. The mass data storage 708 may include a hard disk drive (HDD). The HDD may be a mini-HDD that includes one or more platters having a diameter that is smaller than approximately 1.8". The DVD drive 700 may be connected to memory 709 such as RAM, ROM, low-latency nonvolatile memory such as flash memory, and/or other suitable electronic data storage.

Figure 13:
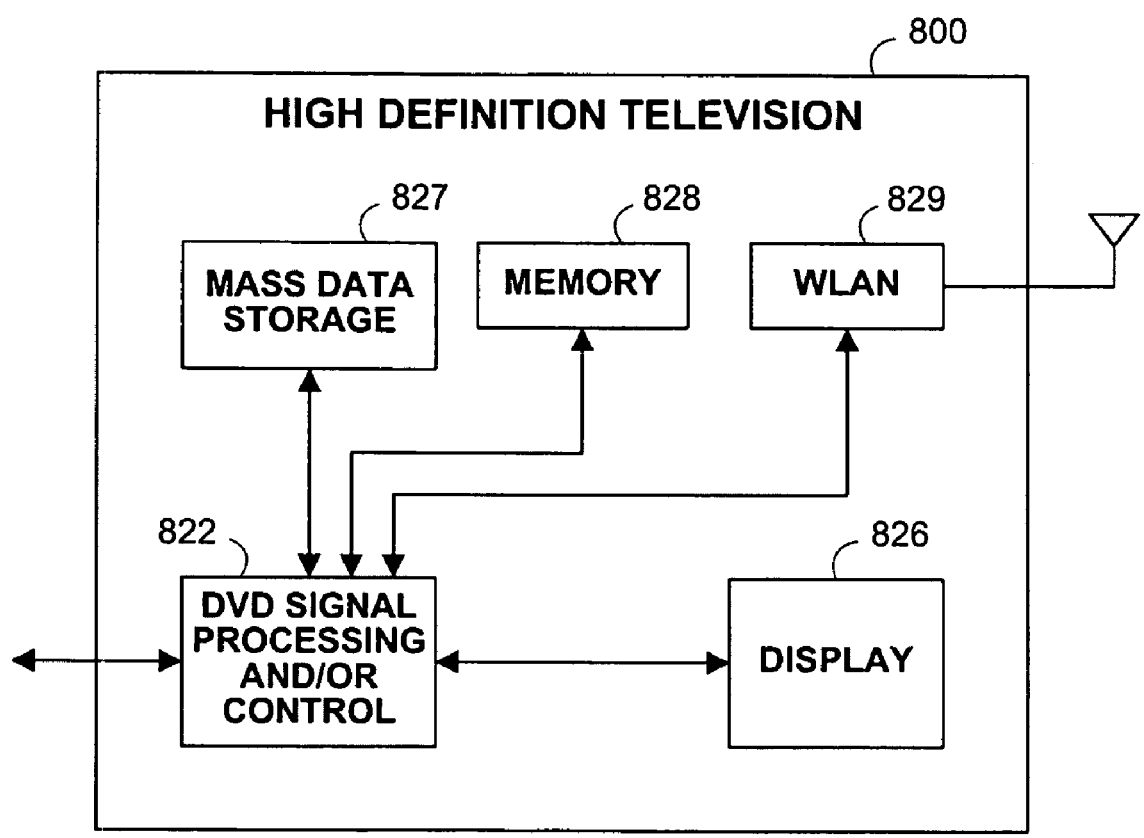
FIG. 13 is a block diagram of an exemplary high definition television that can employ the disclosed technology.

Referring now to FIG. 13, the present invention can be implemented in a high definition television (HDTV) 800. The present invention may implement either or both signal processing and/or control circuits, which are generally identified in FIG. 13 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 800 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one DVD drive may have the configuration shown in FIG. 11. The HDTV 800 may be connected to memory 828 such as RAM, ROM, low-latency nonvolatile memory such as flash memory, and/or other suitable electronic data storage. The HDTV 800 also may support connections with a WLAN via a WLAN network interface 829.

Figure 14:
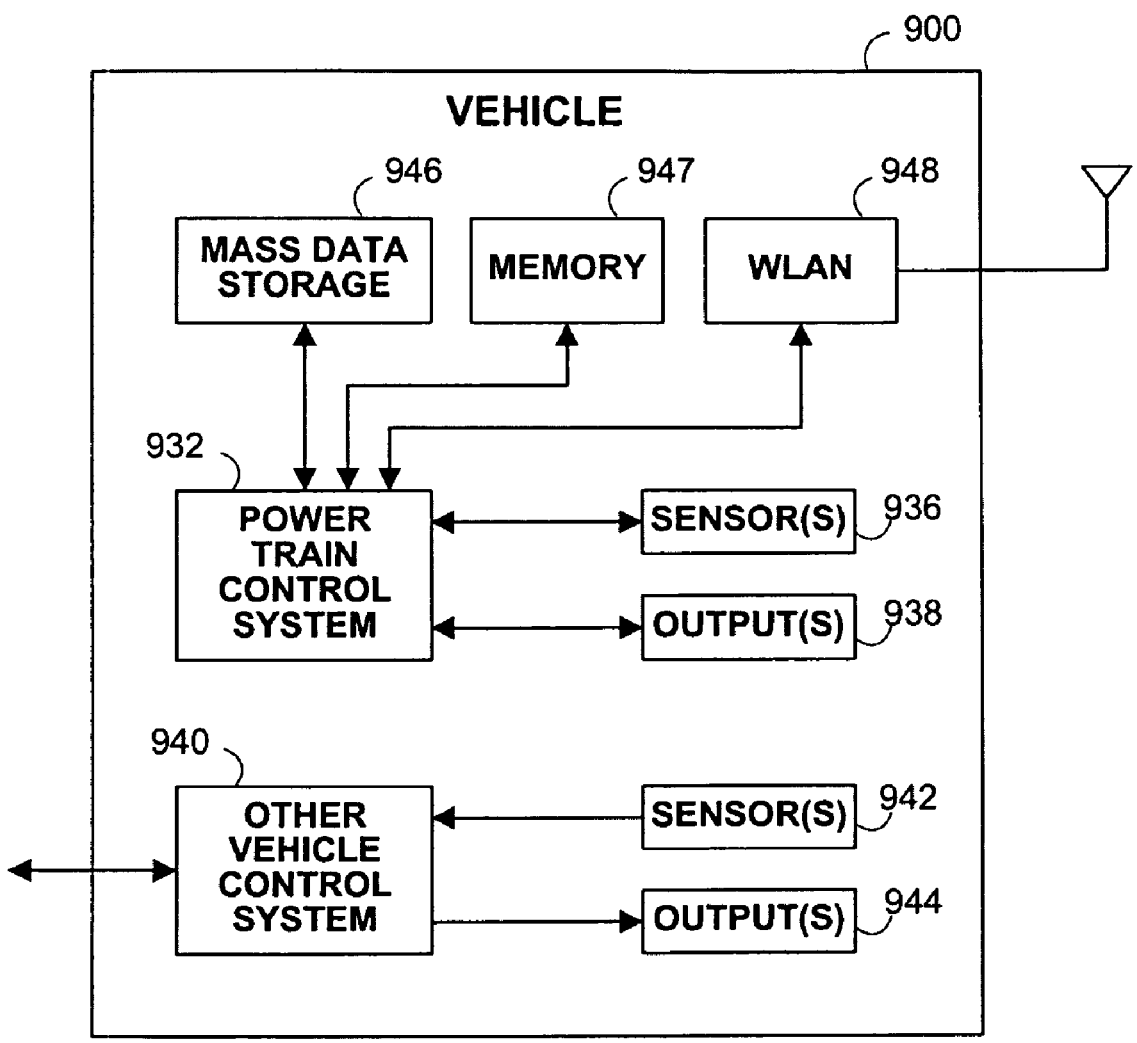
FIG. 14 is a block diagram of an exemplary vehicle that can employ the disclosed technology.

Referring now to FIG. 14, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one DVD drive may have the configuration shown in FIG. 12. The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 15:
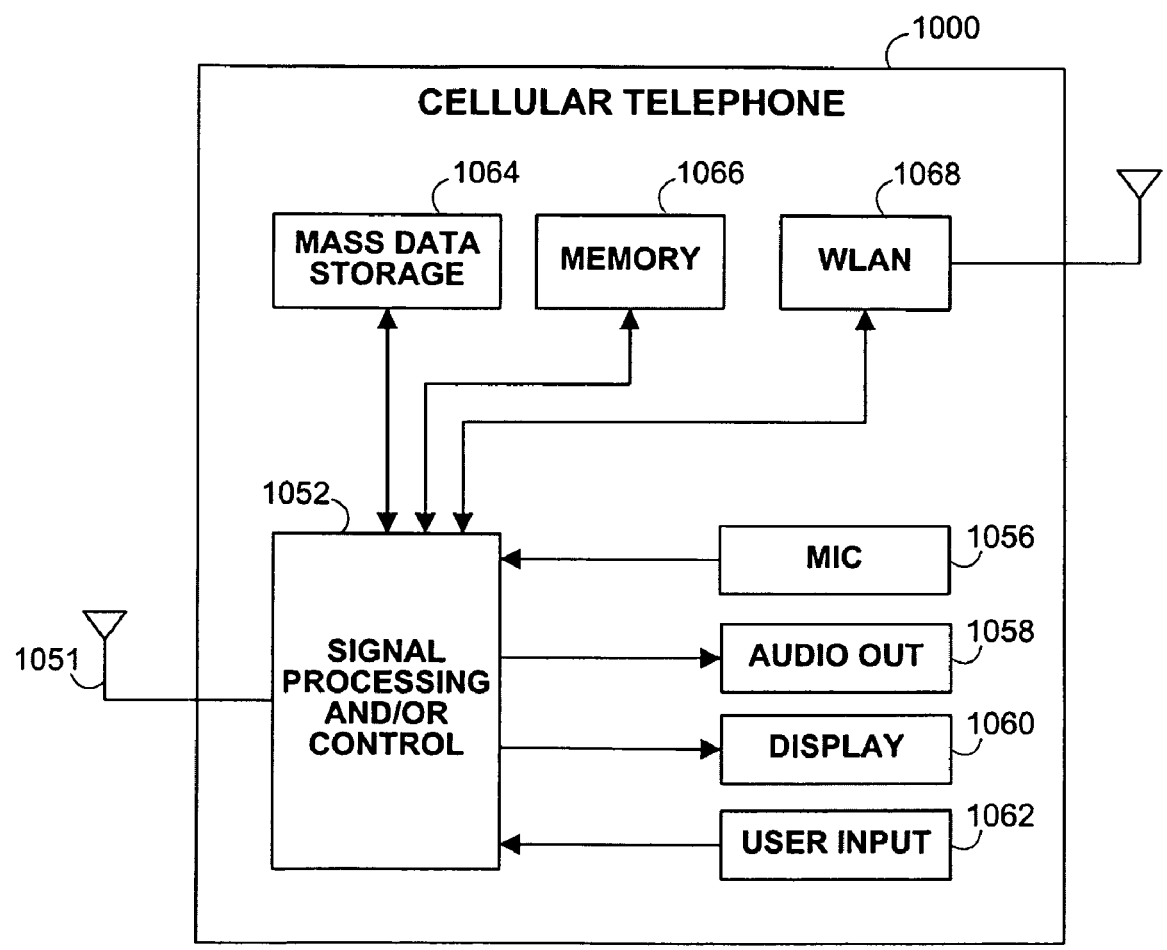
FIG. 15 is a block diagram of an exemplary cellular telephone that can employ the disclosed technology.

Referring now to FIG. 15, the present invention can be implemented in a cellular telephone 1000 that may include a cellular antenna 1051. The present invention may implement either or both signal processing and/or control circuits, which are generally identified in FIG. 15 at 1052, a WLAN interface and/or mass data storage of the cellular phone 1000. In some implementations, the cellular telephone 1000 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1050 may process data, perform coding and/or encryption, perform calculations, format data and/or perform other cellular telephone functions.

The cellular telephone 1000 may communicate with mass data storage 1064 that stores data in a nonvolatile manner such as optical and/or magnetic storage devices—for example hard disk drives (HDDs) and/or DVDs. At least one DVD drive may have the configuration shown in FIG. 12. The HDD may be a mini-HDD that includes one or more platters having a diameter that is smaller than approximately 1.8". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 16:
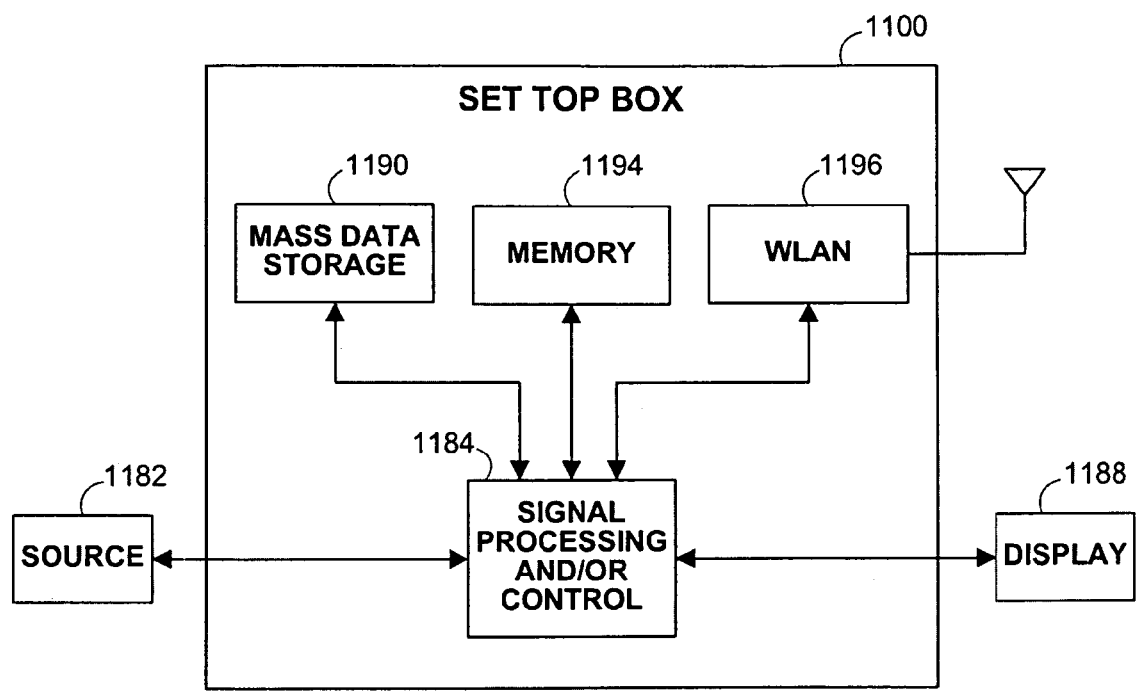
FIG. 16 is a block diagram of an exemplary set top box that can employ the disclosed technology.

Referring now to FIG. 16, the present invention can be implemented in a set top box 1100. The present invention may implement either or both signal processing and/or control circuits, which are generally identified in FIG. 16 at 1184, a WLAN interface and/or mass data storage of the set top box 1100. Set top box 1100 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1100 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDs. At least one DVD drive may have the configuration shown in FIG. 12. Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 17:
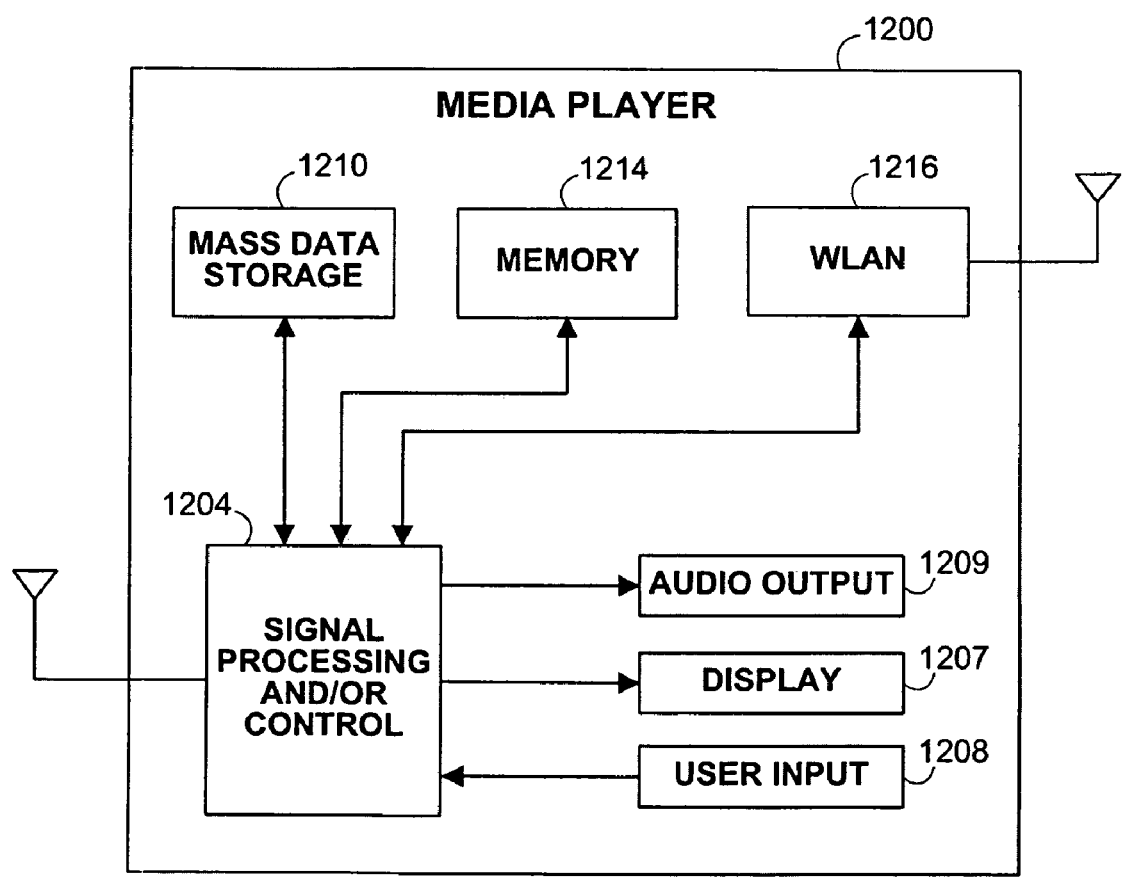
FIG. 17 is a block diagram of an exemplary media player that can employ the disclosed technology.

Referring now to FIG. 17, the present invention can be implemented in a media player 1200. The present invention may implement either or both signal processing and/or control circuits, which are generally identified in FIG. 17 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one DVD drive may have the configuration shown in FIG. 12. Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for decoding a block of data in a data channel that uses iterative decoding, wherein:

said data is encoded using a code representable by a matrix; and said method comprises:
breaking said block of data into smaller data blocks defined by portions of said matrix,
interleaving data in said smaller data blocks, said interleaving comprising interleaving a proper subset of said smaller data blocks, and
decoding said interleaved data.

2. The method of claim 1 wherein said interleaving comprises interleaving each of said smaller data blocks individually.

3. The method of claim 1 further comprising cyclically permuting data in each of said smaller data blocks.

4. The method of claim 1 wherein said code is quasi-cyclic code having subunits of a repeating uniform size.

5. The method of claim 4 wherein:
said subunits are arranged in block columns; and
said interleaving comprises interleaving said block columns.

6. The method of claim 5 wherein said block columns are interleaved individually.

7. The method of claim 5 wherein up to three said block columns are interleaved together.

8. The method of claim 4 wherein said interleaving comprises interleaving data in amounts equal in size to said subunits.

9. The method of claim 4 wherein said interleaving comprises interleaving data in amounts equal in size to multiples of up to three of said subunits.

10. An iterative decoding apparatus for a block of data in a data channel, wherein:

said data is encoded using a code representable by a matrix; and said iterative decoding apparatus comprises:
a plurality of detectors for detecting, in said block of data, smaller data blocks defined by portions of said matrix,
an iterative decoder for decoding said detected smaller data blocks, and
at least one interleaver for interleaving data in said smaller data blocks prior to said decoding.

11. The iterative decoding apparatus of claim 10 wherein said interleaver interleaves each of said smaller data blocks individually.

12. The iterative decoding apparatus of claim 10 wherein said interleaver interleaves together a proper subset of said smaller data blocks.

13. The iterative decoding apparatus of claim 10 further comprising circuitry for cyclically permuting data in each of said smaller data blocks.

14. The iterative decoding apparatus of claim 9 wherein said code is quasi-cyclic code having subunits of a repeating uniform size.

15. The iterative decoding apparatus of claim 14 wherein:
said subunits are arranged in block columns; and
said interleaver interleaves said block columns.

16. The iterative decoding apparatus of claim 15 wherein said interleaver interleaves said block columns individually.

17. The iterative decoding apparatus of claim 15 wherein said interleaver interleaves together up to three of said block columns.

18. The iterative decoding apparatus of claim 14 wherein said interleaver interleaves data in amounts equal in size to said subunits.

19. The iterative decoding apparatus of claim 14 wherein said interleaver interleaves data in amounts equal in size to multiples of up to three of said subunits.

* * * * *